(12) United States Patent
Fukuda

(10) Patent No.: US 7,923,966 B2
(45) Date of Patent: Apr. 12, 2011

(54) BATTERY CONTROL DEVICE, BATTERY CONTROL METHOD, POWER SOURCE CONTROL DEVICE AND ELECTRONIC APPARATUS

(75) Inventor: Hideo Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 277 days.

(21) Appl. No.: 11/882,698

(22) Filed: Aug. 3, 2007

(65) Prior Publication Data

US 2008/0054909 A1 Mar. 6, 2008

(30) Foreign Application Priority Data

Sep. 4, 2006 (JP) ................................. 2006-238679

(51) Int. Cl.
*H02J 7/00* (2006.01)
*G01N 27/416* (2006.01)
(52) U.S. Cl. ........ 320/132; 320/134; 320/136; 320/150; 320/162; 324/427; 324/430
(58) Field of Classification Search .................. 324/430; 320/132
See application file for complete search history.

(56) References Cited

U.S. PATENT DOCUMENTS

| 5,404,106 | A | | 4/1995 | Matsuda |
| 5,619,077 | A | * | 4/1997 | Green et al. ..................... 307/64 |
| 5,739,596 | A | | 4/1998 | Takizawa et al. |
| 6,441,619 | B1 | * | 8/2002 | Araki et al. .................. 324/427 |
| 6,495,989 | B1 | | 12/2002 | Eguchi |
| 6,832,171 | B2 | * | 12/2004 | Barsoukov et al. ............. 702/65 |
| 7,078,907 | B2 | | 7/2006 | Uesaka et al. |
| 2003/0205995 | A1 | * | 11/2003 | Odaohhara et al. ....... 324/103 R |
| 2005/0012496 | A1 | | 1/2005 | Taniguchi |
| 2005/0242772 | A1 | * | 11/2005 | Cha ............................... 320/115 |
| 2005/0269991 | A1 | * | 12/2005 | Mitsui et al. .................. 320/132 |
| 2006/0022676 | A1 | | 2/2006 | Uesaka et al. |

FOREIGN PATENT DOCUMENTS

EP 0 736 828 3/1996

(Continued)

OTHER PUBLICATIONS

European Patent Office Communication dated Dec. 4, 2007 regarding corresponding European Patent Application No. 07113683.2-1236.

(Continued)

*Primary Examiner* — Edward Tso
*Assistant Examiner* — Johali A Torres Ruiz
(74) *Attorney, Agent, or Firm* — Fujitsu Patent Center

(57) ABSTRACT

A battery control device 1 has an electric circuit control unit 6 controlling a power supply; a voltage measuring unit 7 measuring a voltage; a current measuring unit 8 measuring an electric current; and a power source control unit 9, wherein the power source control unit 9 measures a first voltage defined as the voltage of the battery 4 and a first current defined as the current of the battery 4 in a state where the battery 4 supplies electric power to the load 3, measures a second voltage defined as the voltage of the battery 4 in a state where the supply of the electric power to the load 3 from the battery 4 is cut off, and calculates internal impedance of the battery 4 by dividing a value, obtained in a way that subtracts the first voltage from the second voltage, by the first current.

20 Claims, 9 Drawing Sheets

FOREIGN PATENT DOCUMENTS

| | | |
|---|---|---|
| EP | 1 077 520 | 8/2000 |
| EP | 1 562 048 | 5/2003 |
| GB | 2278452 | 11/1994 |
| JP | 6-331715 | 12/1994 |
| JP | 8-336241 | 12/1996 |
| JP | 2001-57246 | 2/2001 |
| JP | 2004-163360 | 6/2004 |
| TW | 250297 | 3/2006 |
| TW | 257727 | 7/2006 |
| WO | 02/097456 | 12/2002 |

OTHER PUBLICATIONS

Chinese Office Action issued on May 22, 2009 in corresponding Chinese Patent Application 200710147770.9.

Taiwan Intellectual Property Office; Official Action mailed Aug. 24, 2010, with English-language partial translation, in connection with correspondent patent application 0992058024001.

* cited by examiner

| CORRECTING APPLICATION | | |
|---|---|---|
| (a) ☐ MEASURE IMPEDANCE ONLY ONCE | | |
| (b) ☐ MEASURE IMPEDANCE PERIODICALLY | | |
| (c) ☐ EVERY WEEK, MONDAY, 9:00 | | |
| (d) ☐ EVERY MONTH, 26TH DAY, 9:00 | | SETTING |

BATTERY CONTROL DEVICE, BATTERY CONTROL METHOD, POWER SOURCE CONTROL DEVICE AND ELECTRONIC APPARATUS

BACKGROUND OF THE INVENTION

The present invention relates to a battery control device, a battery control method, a power source control device and an electronic apparatus.

A method of measuring a residual quantity of a battery is categorized into a current integration method and a voltage method. The current integration method is a method of measuring the residual quantity of the battery by subtracting an integrated value of a discharge current from a whole capacity of the battery. The voltage method is a method of previously obtaining a relationship between an open-circuit voltage and the battery residual quantity, and measuring the battery residual quantity from the open-circuit voltage.

Note that the open-circuit voltage is calculated from the battery voltage, the battery current and battery internal impedance. Further, the whole capacity of the battery is obtained by measuring an integrated value of the discharge current when discharging the electricity up to an over-discharge state from a full-charge state.

The multiplicity of electronic apparatuses of which power sources is batteries involve utilizing a residual quantity of the battery (refer to, e.g., Patent documents 1-3).

[Patent document 1] Japanese Patent Application Laid-Open Publication No. 2004-163360

[Patent document 2] Japanese Patent Application Laid-Open Publication No. 2001-57246

[Patent document 3] Japanese Patent Application Laid-Open Publication No. 8-336241

SUMMARY OF THE INVENTION

In the case of measuring the battery residual quantity by the current integration method, the whole capacity decreases as the battery gets deteriorated, and it is therefore required that the whole capacity be periodically corrected. On the occasion of measuring the whole capacity of the battery, however, the battery is required to discharge the electricity up to an over-discharge state from a full-charge state, and hence a considerable period of time is needed for the measurement.

In the case of measuring the battery residual quantity by the voltage method, the internal impedance rises as the battery gets deteriorated, and hence the internal impedance needs correcting periodically. On the occasion of measuring the internal impedance of the battery, however, a quantity of power consumption of a load needs changing in a state where an AC adaptor etc as an external power source is detached, so that the measurement is time-consuming.

Under such circumstances, it is an object of the present invention to provide a battery control device, a battery control method, a power source control device and an electronic apparatus that easily measure a state of the battery.

According to the present invention, in order to solve the problems, a voltage and an electric current of a battery are measured in a state where a load is supplied with electric power, the voltage of the battery is measured in a state where the power supply to the load is cut off, and internal impedance is calculated from the measured values thereof.

To give an in-depth description, a battery control device comprises: an electric circuit control unit controlling a power supply to a load from a battery; a voltage measuring unit measuring a voltage of the battery; a current measuring unit measuring an electric current of the battery; and a power source control unit outputting a control signal to the electric circuit control unit, and inputting measurement signals from the voltage measuring unit and the current measuring unit, wherein the power source control unit measures a first voltage defined as the voltage of the battery and a first current defined as the current of the battery in a state where the battery supplies electric power to the load, further measures a second voltage defined as the voltage of the battery in a state where the supply of the electric power to the load from the battery is cut off, and calculates internal impedance of the battery by dividing a value, obtained in a way that subtracts the first voltage from the second voltage, by the first current.

The battery control device according to the present invention includes the electric circuit control unit, the voltage measuring unit, the current measuring unit, and the power source control unit. The power source control unit outputs a control signal to the electric circuit control unit, inputs measurement signals from the voltage measuring unit and the current measuring unit, and controls the electric circuit control unit and also processing of the signals transmitted from the voltage measuring unit and the current measuring unit.

The electric circuit control unit controls the power supply from the battery to the load. To be specific, the electric circuit control unit starts and stops supplying the electric power to the load from the battery in accordance with a command from the power source control unit. The control of the power supply to the load from the battery may be done not only by stopping the power supply to the load but also by stopping the power supply to the load from the battery in a way that switches over a source of the power supply to the load to another power source.

The voltage measuring unit measures the voltage of the battery. The voltage measuring unit transmits a signal about the measured voltage of the battery to the power source control unit. The voltage measuring unit is capable of measuring the voltage of the battery even in a state where the battery supplies the electric power to the load or in a state where the battery does not supply the electric power thereto. Namely, the voltage measuring unit is capable of measuring both of the load-applied voltage and the open-circuit voltage of the battery.

The current measuring unit measures the electric current of the battery. The current measuring unit transmits a signal about the measured electric current of the battery to the power source control unit. The current measuring unit is capable of measuring the output current of the battery in the state where the battery supplies the electric power to the load.

The power source control unit controls the electric circuit control unit, processes the signals transmitted from the voltage measuring unit and the current measuring unit, and checks the state of the battery.

Specifically, the power source control unit measures the voltage and the electric current of the battery in the state where the battery supplies the electric power to the load by controlling the electric circuit control unit. This voltage is the so-called load-applied voltage of the battery and is referred to as a "first voltage" in the present specification. Further, this current is a so-called load-applied current and is referred to as a "first current" in the present specification.

Next, the power source control unit measures the voltage of the battery in the state where the power supply to the load from the battery is cut off by controlling the electric circuit control unit. This voltage is the so-called open-circuit voltage of the battery and is referred to as a "second voltage" in the present specification.

Next, the power source control unit calculates, based on the measured first voltage, first current and second voltage, the internal impedance of the battery. Herein, the battery comes to have a potential difference between the open-circuit voltage and the load-applied voltage of the battery. This is because when the electric power is outputted from the battery, a drop occurs in the output voltage due to the internal impedance. The present invention puts an emphasis on such an electrical characteristic of the battery, wherein the value obtained by subtracting the first voltage from the second voltage is divided by the first current. It is possible that calculate the internal impedance of the battery by dividing the voltage drop quantity by the current, based on Ohm's law.

From the above, the battery control device according to the present invention includes the electric circuit control unit that controls the power supply to the load from the battery, whereby the internal impedance as one of indexes indicating a state of the battery can be easily measured.

Herein, the power source control unit may further measure a third voltage defined as the voltage of the battery and a second current defined as the electric current of the battery in the state where the battery supplies the electric power to the load, and may further calculate an open-circuit voltage of the battery by adding the third voltage to a value obtained in a way that multiplies the internal impedance by the second current.

If the internal impedance of the battery has already been calculated, the open-circuit voltage of the battery can be measured even in the state where the battery supplies the electric power to the load. It is because the open-circuit voltage of the battery in the state of supplying the electric power takes a value obtained by adding an amount of the voltage drop due to the internal impedance to the output voltage of the battery.

Such being the case, in the battery control device according to the present invention, the power source control unit further measures the voltage and the electric current of the battery in the state where the battery supplies the electric power to the load. This voltage is the so-called load-applied voltage of the battery and is referred to as a "third voltage" in the present specification. Further, this current is the so-called load-applied current of the battery and is referred to as a "second current" in the present specification.

Next, the power source control unit calculates the open-circuit voltage of the battery on the basis of the measured third voltage and second current. The pre-calculated internal impedance is multiplied by the second current, and the third voltage is added to the calculated value. The amount of the voltage drop due to the internal impedance is thereby added to the load-applied voltage, and the open-circuit voltage of the battery is calculated even in the state where the battery supplies the electric power to the load.

From the above, the battery control device according to the present invention is capable of easily measuring the open-circuit voltage of the battery even in the state where the battery supplies the electric power to the load.

Herein, the battery control device may further comprise a pre-generated map representing a relationship between the open-circuit voltage and a battery residual quantity ratio defined as a value showing a ratio at which a residual quantity of the battery occupies the whole capacity thereof, wherein the power source control unit may further acquire the battery residual quantity ratio of the battery by collating the open-circuit voltage with the map.

The battery has an interrelationship between the residual quantity and the open-circuit voltage. Namely, if providing the map containing the relationship between the residual quantity and the open-circuit voltage that have been previously measured and thus obtained, it is possible to acquire a battery residual quantity ratio defined as a value representing a ratio at which the residual quantity of the battery occupies the whole capacity by measuring the open-circuit voltage of the battery. Then, the battery control device according to the present invention includes the map containing the predetermined relationship between the battery residual quantity ratio and the open-circuit voltage. The calculated open-circuit voltage is further collated with the map, thereby enabling the battery residual quantity ratio to be obtained even in the state where the battery supplies the electric power to the load.

From the above, the battery control device according to the present invention enables the battery residual quantity ratio to be easily measured in the state where the battery supplies the electric power to the load.

Herein, the power source control unit may calculate the open-circuit voltage in a first battery state as a battery state before the residual quantity decreases, further measure a first battery residual quantity ratio defined as a value showing a ratio at which the residual quantity of the battery occupies the whole capacity thereof by collating the open-circuit voltage with the map, calculate the open-circuit voltage of the battery in a second battery state that is a battery state after the residual quantity has decreased, further measure a second battery residual quantity ratio defined as a value showing a ratio at which the residual quantity of the battery occupies the whole capacity thereof by collating the open-circuit voltage with the map, still further measure a first integrated current defined as an integrated value of the electric current outputted during a transition of the battery from the first battery state to the second battery state, and further calculate the full-charge capacity of the battery in a way that divides the first integrated current by a value obtained by subtracting the second battery residual quantity ratio from the first battery residual quantity ratio.

The battery residual quantity ratio described above is obtained through the map determined from the open-circuit voltage of the battery, and a real-valued full-charge capacity of the battery is not yet determined. This being the case, the first battery state defined as a state of an arbitrary battery residual quantity is compared with the second battery state defined as a state of a residual quantity less than the battery residual quantity in the first battery state. The full-charge capacity of the battery is calculated by measuring an integrated current outputted when the residual quantity of the battery decreases.

To give an in-depth description, the integrated value of the current outputted during a transition from the first battery state to the second battery state, is measured. This current integrated value is referred to as a "first integrated current" in the present specification. Then, the first integrated current is divided by a value obtained in a way that subtracts the second battery residual quantity ratio from the first battery residual quantity ratio. With this contrivance, the full-charge capacity of the battery can be thereby calculated with the simple transition of the battery from the first battery state to the second battery state.

From the above, the battery control device according to the present invention enables the battery full-charge capacity to be easily measured in the state where the battery supplies the electric power to the load.

Further, the present invention is grasped from an aspect of a method. Namely, the present invention is a battery control method of a battery control device comprising: an electric circuit control unit controlling a power supply to a load from a battery; a voltage measuring unit measuring a voltage of the battery; a current measuring unit measuring an electric current of the battery; and a power source control unit outputting a control signal to the electric circuit control unit, and inputting measurement signals from the voltage measuring unit and the current measuring unit, wherein the power source control unit measures a first voltage defined as the voltage of the battery and a first current defined as the current of the battery in a state where the battery supplies electric power to the load, further measures a second voltage defined as the voltage of the battery in a state where the supply of the electric power to the load from the battery is cut off, and calculates internal impedance of the battery by dividing a value, obtained in a way that subtracts the first voltage from the second voltage, by the first current.

Still further, the present invention is a power source control device used for an electronic apparatus comprising: an electric circuit control unit controlling a power supply to a load from a battery; a voltage measuring unit measuring a voltage of the battery; a current measuring unit measuring an electric current of the battery, wherein a first voltage defined as the voltage of the battery and a first current defined as the current of the battery are measured in a state where the battery supplies electric power to the load, further a second voltage defined as the voltage of the battery is measured in a state where the supply of the electric power to the load from the battery is cut off, and internal impedance of the battery is calculated by dividing a value, obtained in a way that subtracts the first voltage from the second voltage, by the first current.

Yet further, the present invention is an electronic apparatus including a battery and driven by electric power, comprising: an electric circuit control unit controlling a power supply to a load within the electronic apparatus from a battery; a voltage measuring unit measuring a voltage of the battery; a current measuring unit measuring an electric current of the battery; and a power source control unit outputting a control signal to the electric circuit control unit, and inputting measurement signals from the voltage measuring unit and the current measuring unit, wherein the power source control unit measures a first voltage defined as the voltage of the battery and a first current defined as the current of the battery in a state where the battery supplies electric power to the load, further measures a second voltage defined as the voltage of the battery in a state where the supply of the electric power to the load from the battery is cut off, and calculates internal impedance of the battery by dividing a value, obtained in a way that subtracts the first voltage from the second voltage, by the first current.

According to the present invention, it is possible to provide the battery control device, the battery control method, the power source control device and the electronic apparatus that easily measure the state of the battery.

DETAILED DESCRIPTION OF THE INVENTION

An embodiment of the present invention will hereinafter be exemplified. The embodiment, which will hereinafter be illustrated, is an exemplification, and the present invention is not limited to this exemplification (configuration).

<Configuration>

Figure 1:
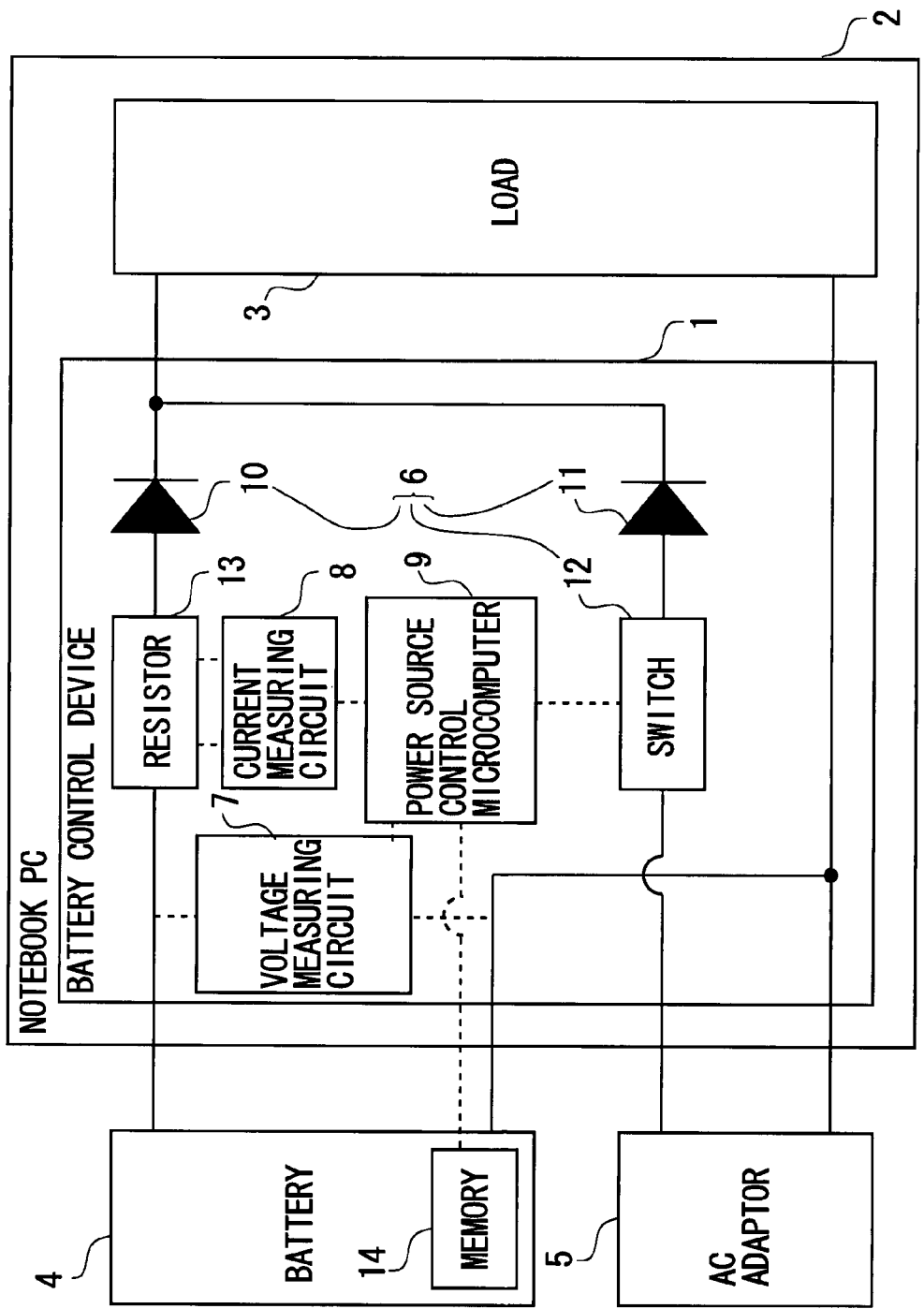
FIG. 1 is a diagram of a configuration of a notebook PC mounted with a battery control device.

FIG. 1 illustrates a diagram of a configuration of a notebook type personal computer (notebook PC) 2 (corresponding to an [electronic apparatus] according to the present invention) mounted with a battery control device 1 according to one embodiment of the present invention. The notebook PC 2 has built-in devices such as a CPU (Central Processing Unit) and a hard disk (which will hereinafter be generically termed a [load 3]). The load 3 is operated by electric power supplied from a battery 4 and an AC adaptor 5 (corresponding to a [power source device] according to the present invention) connected to the notebook PC 2. It is to be noted that the electric power supplied to the load 3 is electrically supplied from the battery 4 and the AC adaptor 5 via the battery control device 1. Further, a premise is that an output voltage of the AC adaptor 5 is higher than an output voltage of the battery 4.

It should be noted that the present embodiment adopts the AC adaptor 5 as a power source other than the battery 4, however, the present invention is not limited to this power source. Namely, even in a state where none of the electric power is supplied from the battery 4, it may be sufficient if the battery control device 1 remains operable. Accordingly, a second battery may be used as a substitute for the AC adaptor 5, and the battery control device 1 may be operated by a power source other than the second battery.

The battery control device 1 includes a switching device 6 (corresponding to an [electric circuit control unit] according to the present invention) that controls a power supply to the load 3 from the battery 4, a voltage measuring circuit 7 (corresponding to a [voltage measuring unit] according to the present invention) that measures a voltage of the battery 4, a current measuring circuit 8 (corresponding to a [current measuring unit] according to the present invention) that measures an electric current of the battery 4, and a power source control microcomputer 9 (corresponding to a [power source control unit] according to the present invention) that outputs a control signal to the switching device 6 and inputs measurement signals given from the voltage measuring circuit 7 and from the current measuring circuit 8. Note that the battery control device 1 may be electrically connected to a memory 14 provided inside the battery 4.

The switching device 6 includes a diode 10 (corresponding to a [first diode] according to the present invention) that blocks a reverse current to the battery 4, a diode 11 (corresponding to a [second diode] according to the present invention) that blocks the reverse current to an AC adaptor 5, and a switch 12 that opens and closes an electric circuit connecting the AC adaptor 5 to the load 3. The switch 12 performs opening/closing operations upon receiving a command from the power source control microcomputer 9. When switch 12 opens, the electric power is supplied to the load 3 from the battery 4. While on the other hand, when the switch 12 closes, because of an output voltage of the AC adaptor 5 being higher than an output voltage of the battery 4, the power supply to the load 3 from the battery 4 is stopped, and the power supply to the load 3 from the AC adaptor 5 is started. Namely, the switch 12 thus opens and closes, thereby controlling the power supply to the load 3 from the battery 4. It should be noted that the switch 12 may involve using a semiconductor switch etc in addition to the switching unit such as an electromagnetic contactor that physically opens and closes the electric circuit. Thus, a power source switchover circuit is built up by the circuit constructed of the diode 10, the diode 11 and the switch 12, whereby the power source can be switched over without any instantaneous drop of the voltage of the load 3. Further, on the occasion of measuring internal impedance, a capacitance, etc of the battery 4, the AC adaptor 5 does not need detaching. Note that the switch 12 may also be provided halfway of the electric circuit extending from the battery 4 to the load 3.

The voltage measuring circuit 7 measures a potential difference between a positive pole and a negative pole of the battery 4, and transmits a signal about the output voltage of the battery 4 to the power source control microcomputer 9. Note that the voltage measuring circuit 7 is capable of always measuring and transmitting, irrespective of the opening/closing states of the switch 12, the output voltage of the battery 4 to the power source control microcomputer 9.

The current measuring circuit 8 measures an output current of the battery 4, and transmits a signal about the output current of the battery 4 to the power source control microcomputer 9. The measurement of the output current of the battery 4 involves measuring a quantity of voltage drop at a resistor 13 provided between the battery 4 and the load 3, and measuring the output current of the battery 4 from the quantity of the voltage drop and a resistance value. It is to be noted that if the power supply to the load 3 from the battery 4 is stopped by closing the switch 12, the output current of the battery 4, which is measured by the current measuring circuit 8, becomes, as a matter of course, 0(A).

The power source control microcomputer 9 controls the power supply to the load 3 from the battery 4 by opening and closing the switch 12 of the switching device 6, and measures a state of the battery 4 on the basis of the signals transmitted from the voltage measuring circuit 7 and from the current measuring circuit 8. Moreover, the power source control microcomputer 9 is constructed of a CPU (Central Processing Unit), memory mediums such as a ROM (Read Only Memory) and a RAM (Random Access Memory), and also input/output interfaces, etc, wherein the respective operations of the battery control device 1 are actualized by executing programs preinstalled into the memory mediums.

<Control Flow>

Figure 2:
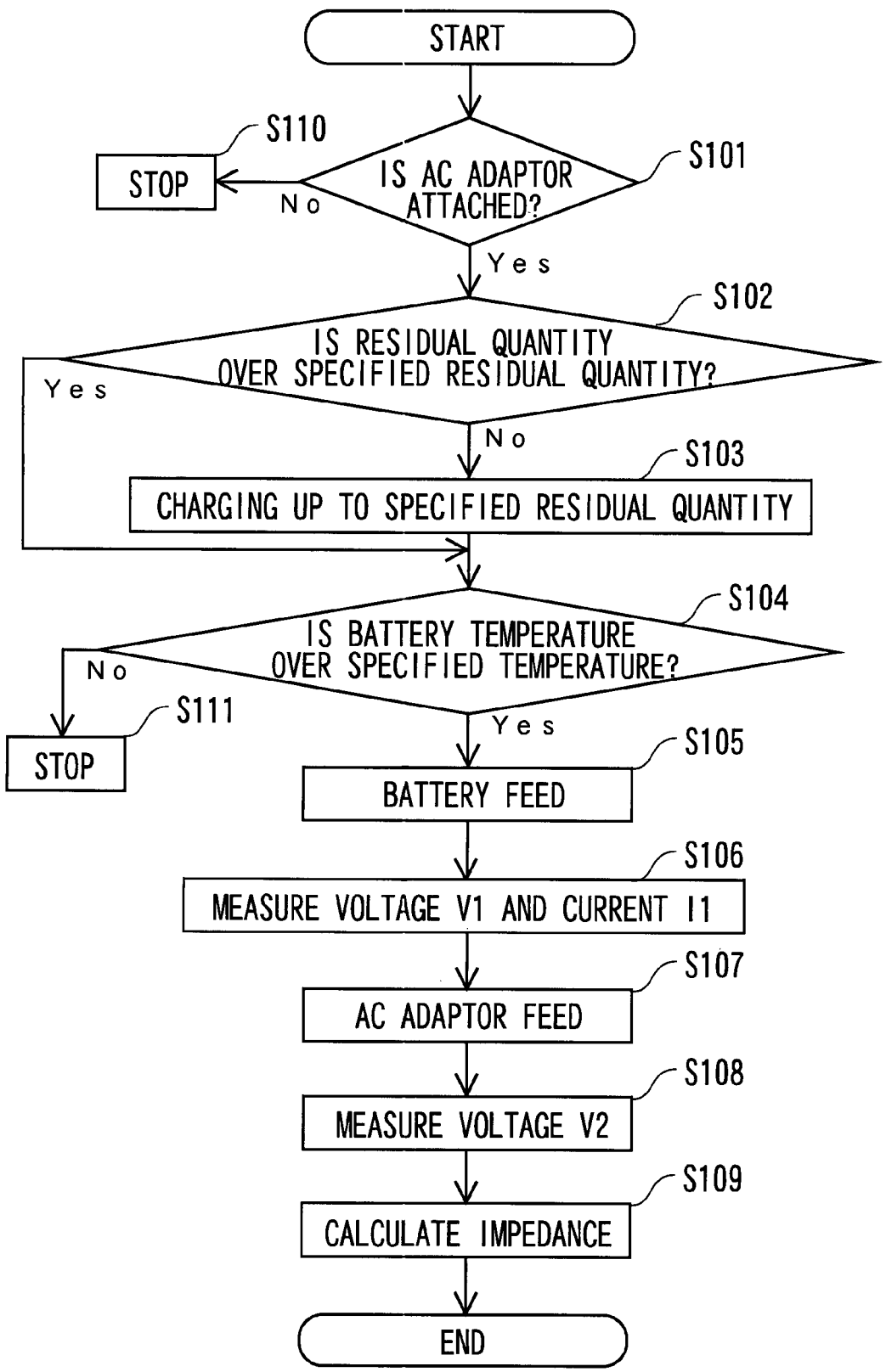
FIG. 2 is a flowchart of control by the battery control device.

Next, operations of the battery control device 1 according to the embodiment will hereinafter be described. FIG. 2 is a flowchart of the control of the battery control device 1 according to the embodiment. The respective operations of the battery control device 1 will hereinafter be explained with reference to the flowchart in FIG. 2.

When the battery control device 1 is started up by pressing a power switch of the notebook PC 2, the power source control microcomputer 9 checks whether the AC adaptor 5 is attached to the notebook PC 2 or not (S101).

If the AC adaptor 5 is not connected, the electric power is not supplied to the load 3 from the AC adaptor 5 even when closing the switch 12. Hence, the power supply to the load 3 from the battery 4 can not be stopped even by opening and closing the switch 12. If the power supply to the load 3 from the battery 4 cannot be stopped, the open-circuit voltage of the battery 4 can not be measured, and it is therefore impossible to measure the internal impedance. Hence, if the AC adaptor 5 is not connected, the measurement of the state of the battery 4 is stopped (S110).

Whereas if the AC adaptor 5 is connected, the power supply to the load 3 from the battery 4 can be cut off by closing the switch 12. It is therefore possible to measure the open-circuit voltage of the battery 4. When the open-circuit voltage of the battery 4 can be measured, the internal impedance of the battery 4 can be measured based on the output voltage and the output current of the battery 4 when the load is applied. Hence, when the AC adaptor 5 is connected, the operation proceeds to next step (S102).

The power source control microcomputer 9 checks whether or not a residual quantity of the battery 4 includes a specified residual quantity (which is the battery residual quantity enabling the load 3 to operate during the cut-off of the power supply to the load 3 from, e.g., the AC adaptor 5) (S102).

If the residual quantity of the battery 4 is less than the specified residual quantity, the residual quantity of the battery 4 gets dissipated eventually due to power consumption of the load 3 while the switch 12 remains opening. For preventing the notebook PC 2 from getting into shutdown, the battery 4 is charged with the electricity till the residual quantity of the battery 4 reaches the specified residual quantity (S103).

If the residual quantity of the battery 4 is larger than the specified residual quantity, it does not happen that the residual quantity of the battery 4 gets dissipated due to the power consumption of the load 3 even when opening the switch 12, and consequently the operation proceeds to next step (S104).

The power source control microcomputer 9 checks whether or not the temperature of the battery 4 includes a specified temperature (which corresponds to a [predetermined temperature] according to the present invention and is, e.g., a temperature at which the capacity of the battery 4 satisfies a design value) (S104).

If the temperature of the battery 4 is lower than the specified temperature, the capacity of the battery 4 changes. Hence, the battery 4 in a state of deviating from the proper temperature is disabled to get its capacity etc measured with high accuracy, and therefore the measurement of the state of the battery 4 is stopped (S111).

If the temperature of the battery 4 is higher than the specified temperature, the battery 4 is in a proper state (e.g., a state where the capacity satisfies the design value), so that the operation proceeds to next step (S105). Note that if an environment in which to use the notebook PC 2 is such an environment that the temperature of the battery 4 does not deviate from the specified temperature, S104 and S111 may be omitted.

Figure 3:
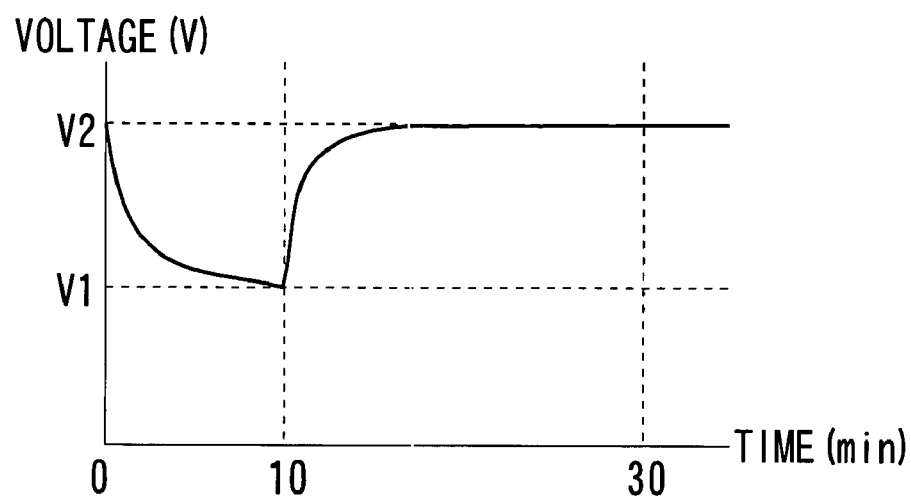
FIG. 3 is a graph showing a time-based change in output voltage of a battery.
Figure 4:
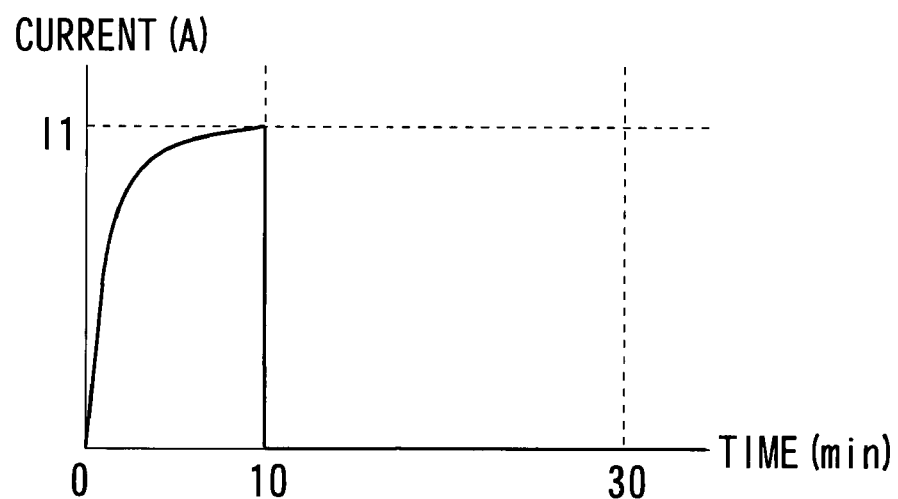
FIG. 4 is a graph showing a time-based change in output current of the battery.

The power source control microcomputer 9 switches over the source of the power supply to the load 3 from the AC adaptor 5 to the battery 4 by opening the switch 12 (S105). Time when switching over the source of the power supply to the load 3 from the AC adaptor 5 to the battery 4 is set to 0 min. FIGS. 3 and 4 show changes in voltage and in current of the battery 4 at this time. FIG. 3 is a graph showing the time-based change in output voltage of the battery 4. As shown in FIG. 3, the output voltage of the battery 4 abruptly drops simultaneously when starting the supply of the electricity to the load 3 and halts for another change at a point of a time elapse of approximately 10 min. Further, FIG. 4 is a graph showing the time-based change in output current of the battery 4. As shown in FIG. 4, the output current of the battery 4 abruptly rises simultaneously when starting the supply of the electricity to the load 3 and halts for another change at a point of a time elapse of approximately 10 min.

The power source control microcomputer 9 acquires a signal about an output voltage (V1) (corresponding to a [first voltage] according to the present invention) of the battery 4 from the voltage measuring circuit 7 after an elapse of 10 min since S105, and acquires a signal about an output current (I1) (corresponding to a [first current] according to the present invention) of the battery 4 from the current measuring circuit 8 (S106). The power source control microcomputer 9 acquires the output voltage (V1) and the output current (I1) of the battery 4, and thereafter the operation proceeds to next step (S107).

The power source control microcomputer 9 switches over the source of the power supply to the load 3 to the AC adaptor 5 from the battery 4 by closing the switch 12 (S107). As shown in FIG. 3, the output voltage of the battery 4 abruptly rises simultaneously with the stop of the electric supply to the load 3, and remains almost completely constant after an elapse of 30 min. Further, as shown in FIG. 4, the output current of the battery 4 turns out to be 0 (A) simultaneously with the stop of the electric supply to the load 3.

The power source control microcomputer 9 acquires a signal about an output voltage (V2) (corresponding to a [second voltage] according to the present invention) of the battery 4 from the voltage measuring circuit 7 after an elapse of 20 min since S107 (i.e., after an elapse of 30 min since S105) (S108). The power source control microcomputer 9 acquires the output voltage (V2) of the battery 4, and thereafter the operation proceeds to next step (S109).

The power source control microcomputer 9 calculates the internal impedance Z (n) of the battery 4 from the acquired values (output voltages and output current) V1, 11 and V2 (S109). The internal impedance Z is calculated by the mathematical expression such as "Z=(V2−V1)÷I1".

<Effect>

From the above, the battery control device 1 according to the embodiment includes the switching device 6 that controls the power supply to the load 3 from the battery 4 and therefore enables the internal impedance of the battery 4 to be easily calculated.

Note that the power source control microcomputer 9 may periodically calculate the internal impedance at an interval of a predetermined period. The internal impedance of the battery 4 changes stepwise according to aged deterioration of the battery, however, the precise internal impedance can be grasped by periodically recalculating the internal impedance. Herein, the phrase "the interval of the predetermined period" connotes an integrated period of charging/discharging time of the battery 4 till the next internal impedance is calculated since the previous internal impedance has been calculated, and connotes, example, a period of time enabling a variation quantity of the internal impedance to be ignored even when repeating the charging/discharging of the battery 4.

Further, the power source control microcomputer 9 may calculate the internal impedance in a state where the battery 4 completes the charge of the battery 4. If the internal impedance is calculated each time the charge of the battery 4 is completed, the residual quantity etc of the battery 4 can be calculated with the high accuracy.

Further, in the embodiment, the power source control microcomputer 9 measures the second voltage V2 after measuring V1 and I1. The present invention is not, however, limited to this measurement mode. Namely, the power source control microcomputer 9 may measure V2 before starting supplying the electricity to the load 3 from the battery 4, and may next measure V1 and I1 in the state where the load 3 is supplied with the electricity from the battery 4.

First Modified Example

Moreover, in the embodiment discussed above, the power source control microcomputer 9 calculates the internal impedance of the battery 4. The present invention is not, however, limited to this calculation mode. Namely, the power source control microcomputer 9 may further calculate the open-circuit voltage of the battery 4 in a state where the load 3 remains being supplied with the electric power from the battery 4 by making the following modification.

To give an in-depth description, the power source control microcomputer 9 measures an output voltage V3 (corresponding to a [third voltage] according to the present invention) of the battery 4 and an output current I2 (corresponding to a [second current] according to the present invention) of the battery 4 in the state where the load 3 remains being supplied with the electric power from the battery 4.

Next, the power source control microcomputer 9 calculates an open-circuit voltage VO (V) of the battery 4 from the already-calculated Z and the newly-obtained measured V3, I2. The open-circuit voltage VO of the battery 4 is calculated by the mathematical expression such as "VO=V3+Z×I2".

From the above, the battery control device 1 according to the first modified example enables the easy measurement of the open-circuit voltage of the battery 4 even in the state the battery 4 supplies the load 3 with the electric power.

Second Modified Example

In the first modified example described above, the power source control microcomputer 9 calculates the open-circuit voltage of the battery 4. The present invention is not, however, limited to this calculation mode. Namely, a battery residual quantity ratio defined as a value representing a ratio at which the residual quantity of the battery 4 occupies the whole capacity, may be further acquired by making the following modification.

Figure 5:
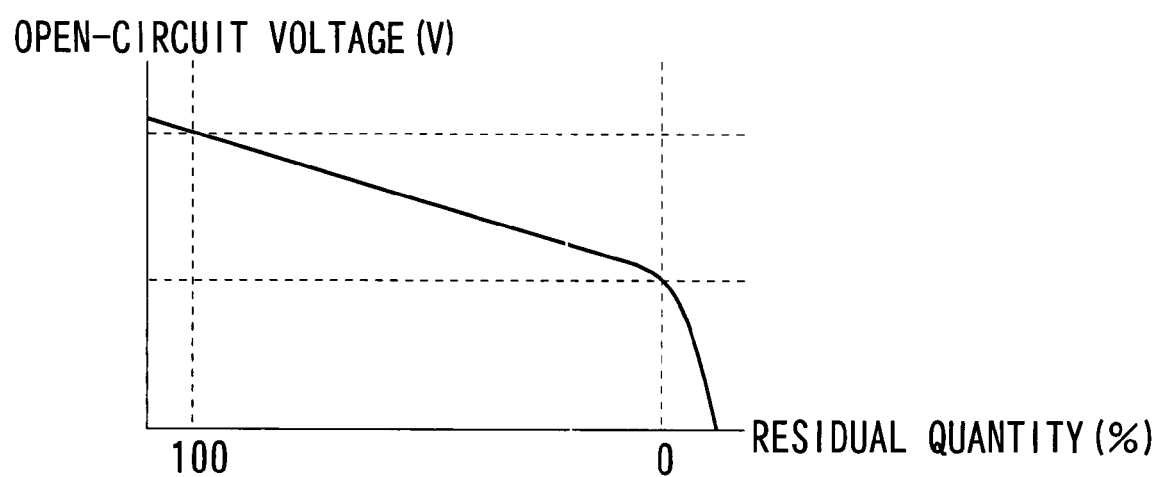
FIG. 5 is a graph showing a relationship between a residual quantity ratio and an open-circuit voltage of the battery.

FIG. 5 is a graph (corresponding to a [map] according to the present invention) showing a relationship between the residual quantity ratio (%) and the open-circuit voltage (V) of the battery 4. The relationship between the residual quantity ratio (%) and the open-circuit voltage (V) of the battery 4 is based on data previously measured by a measuring device when manufacturing the battery 4. Namely, this map is generated in a way that measures stepwise the open-circuit voltage of the battery 4 till the battery 4 comes to a discharge-terminating state from a full-charge state. This type of graph is previously stored as the map in the memory 14 of the battery 4, then, the map is read by the power source control microcomputer 9 when connecting the battery 4 to the battery control device 1, and the open-circuit voltage of the battery 4, which has been calculated in the first modified example, is collated with the map, thereby calculating the residual quantity of the battery 4.

From the above, the battery control device 1 according to the second modified example enables the easy measurement of the residual quantity of the battery 4 even in the state the battery 4 supplies the load 3 with the electric power.

Third Modified Example

The battery control device 1 may further calculate the full-charge capacity of the battery 4 by making the modification as follows. Namely, the control flow of the power source control microcomputer 9 according to the embodiment discussed above is modified as below.

<Control Flow in Third Modified Example>

Figure 6:
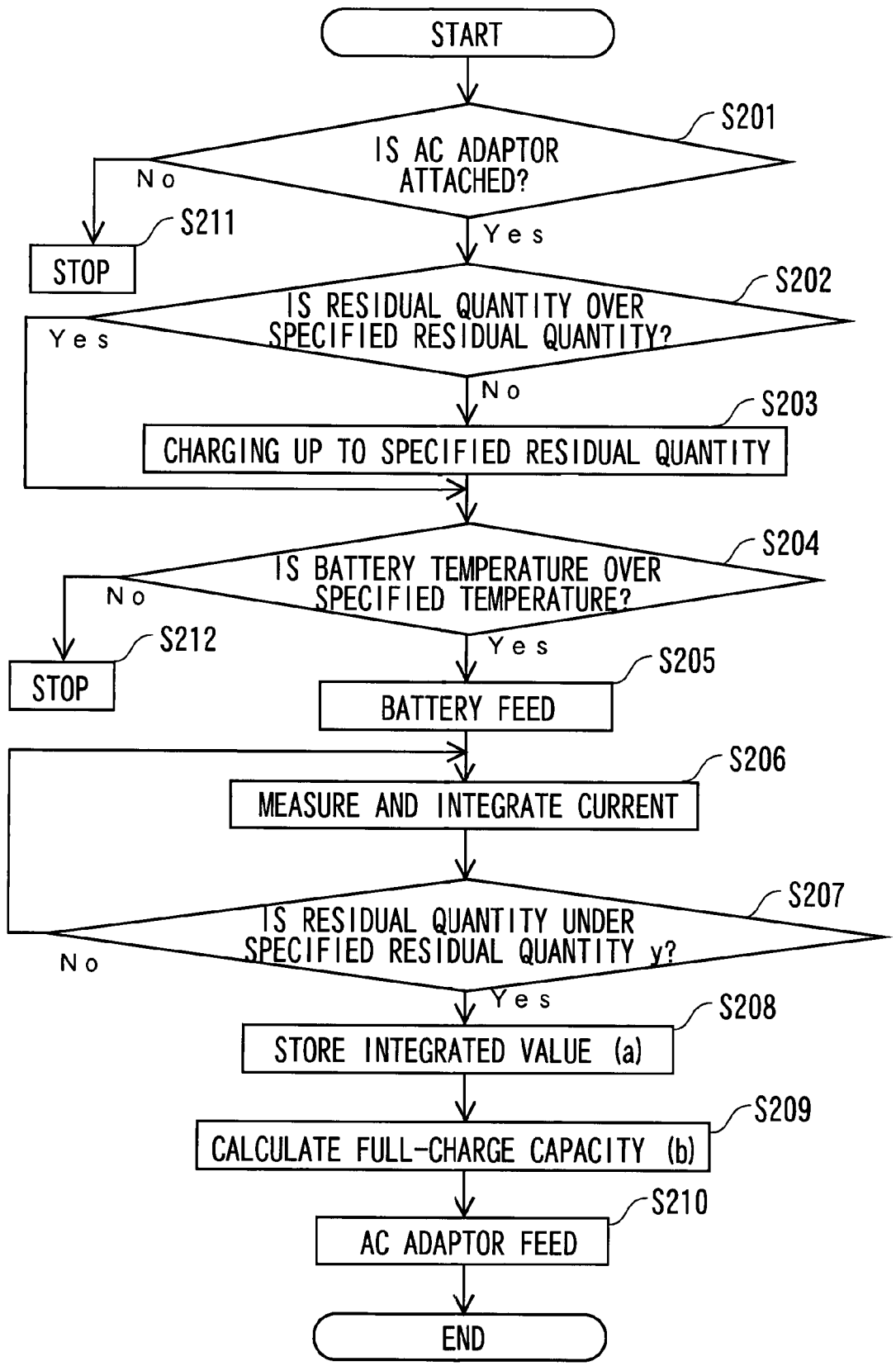
FIG. 6 is a flowchart of the control by the battery control device.

FIG. 6 is a flowchart of the control flow of the battery control device 1 according to a third modified example. The respective operations of the battery control device 1 according to the third modified example will be described with reference to the flowchart in FIG. 6.

In the flowchart shown in FIG. 6, steps S201-S205, S211 and 5212 are the same as S101-S105, S110 and S111 in the embodiment discussed above, and hence their explanations are omitted. Note that if the environment in which to use the notebook PC 2 is the environment where the temperature of the battery 4 does not deviate from the specified temperature, S204 and 5212 may also be omitted.

The power source control microcomputer 9, after switching over the source of the power supply to the load 3 from the AC adaptor 5 to the battery 4 in S205, acquires the signal about the output current of the battery 4, and starts integrating the output current (S206).

Figure 7:
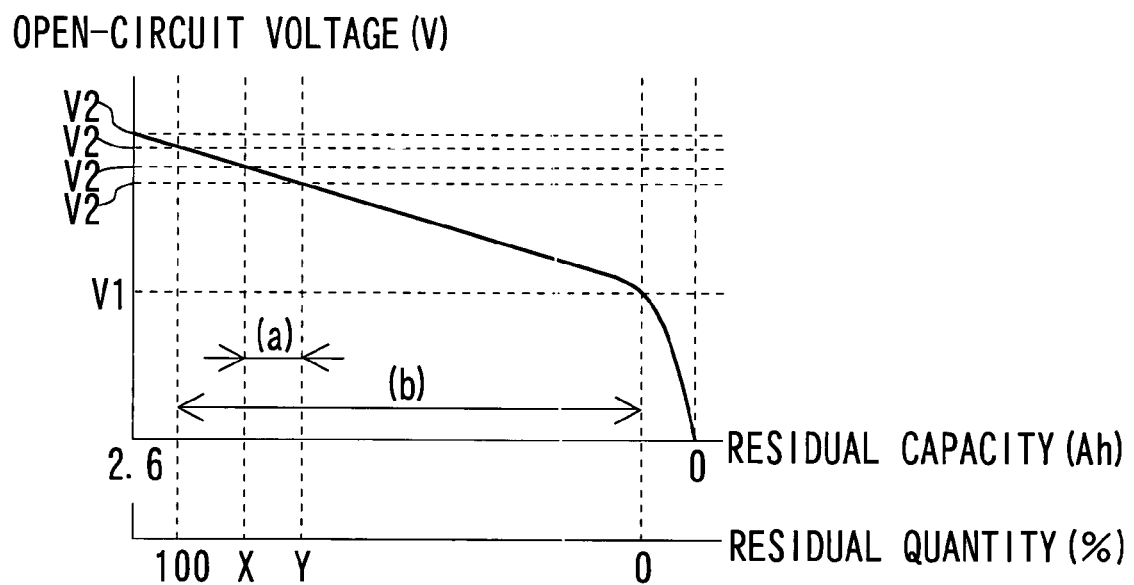
FIG. 7 is a graph showing a relationship between the residual quantity ratio, a residual capacity and the open-circuit voltage of the battery.

FIG. 7 is a graph showing a relationship between the battery residual quantity ratio (%) defined as the value representing the ratio at which the residual quantity of the battery 4 occupies the whole capacity, the residual capacity (Ah) and the open-circuit voltage (V). The power source control microcomputer 9 obtains the residual quantity ratio of the battery 4 from the open-circuit voltage of the battery 4 and the map. Further, an assumption is that the power source control microcomputer 9, when the battery 4 reaches a state (corresponding to a [first battery state] according to the present invention) of an arbitrary residual quantity ratio X (%) (corresponding to a [first battery residual quantity ratio] according to the present invention) in the graph in FIG. 7, starts integrating the output current of the battery 4 (S206).

The power source control microcomputer 9, after starting the integration of the output current of the battery 4 in S206, continues to integrate the output current till the residual quantity of the battery 4 reaches a specified residual quantity ratio Y (%) (S207). The power source control microcomputer 9, when the battery 4 reaches a state (corresponding to a [second battery state] according to the present invention) of the specified residual quantity ratio Y (%) (corresponding to a [second battery residual quantity ratio] according to the present invention) smaller than the residual quantity ratio X (%), stops integrating the output current, and stores an integrated value (indicated by (a) in FIG. 7) (which corresponds to a [first integrated current] according to the present invention) of the output current (S208). The power source control microcomputer 9 acquires the integrated value of the output current of the battery 4, and thereafter moves to next step (S209).

The power source control microcomputer 9 calculates a full-charge capacity (indicated by (b) in FIG. 7) of the battery 4 from the acquired integrated value, residual quantity ratio X and residual quantity ratio Y (S209). The full-charge capacity of the battery 4 is calculated by a mathematical expression such as "Full-Charge Capacity=Integrated Value×100 (Residual Quantity Ratio X−Residual Quantity Ratio Y)". The power source control microcomputer 9 calculates the full-charge capacity of the battery 4, and therefore moves to next step (S210).

The power source control microcomputer 9 closes the switch 12 in order to restrain a decrease in residual quantity of the battery 4, and switches over the source of the power supply to the load 3 from the battery 4 to the AC adaptor 5.

<Effect in Third Modified Example>

From the above, the battery control device 1 according to the third modified example enables the full-charge capacity of the battery 4 to be measured even in the state the battery 4 supplies the load 3 with the electric power.

It is to be noted that the full-charge capacity may be measured within a predetermined period of time since the internal impedance has been calculated. If a period of time till the full-charge capacity is measured since the internal impedance has been calculated is too long, it follows that the internal impedance might change due to the aged deterioration of the battery, and the precise full-charge capacity can not be calculated. Herein, the "predetermined period" connotes the integrated period of usage time of the battery 4, e.g., the period of time enabling the variation quantity of the internal impedance to be ignored even when repeating the charging/discharging of the battery 4.

Moreover, the full-charge capacity may be measured repeatedly at the interval of the predetermined period. The full-charge capacity of the battery 4 changes due to the aged deterioration etc of the battery 4. Accordingly, if the interval of measuring the full-charge capacity is too long, such a case might arise that there is a large discrepancy between the battery residual quantity ratio to be calculated and the actual battery residual quantity ratio. The accurate full-charge capacity can be grasped by periodically repeating the measurement of the full-charge capacity of the battery 4.

Fourth Modified Example

The battery control device 1 may further correct the full-charge capacity of the battery 4 by making the modification as follows. Namely, the control flow of the power source control microcomputer 9 according to the embodiment discussed above is modified as below.

<Control Flow in Fourth Modified Example>

Figure 8:
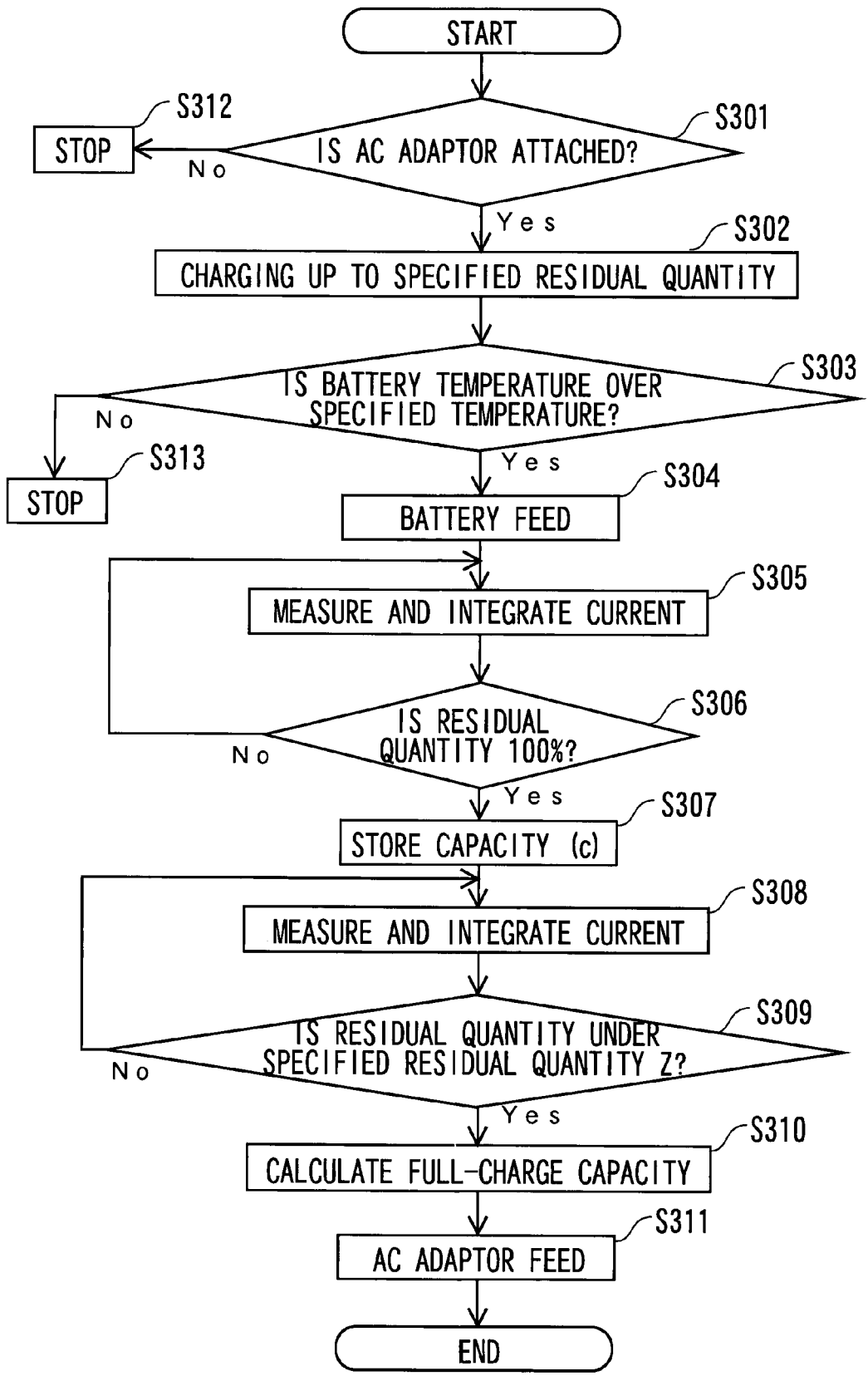
FIG. 8 is a flowchart of the control by the battery control device.

FIG. 8 is a flowchart of the control flow of the battery control device 1 according to a fourth modified example. The respective operations of the battery control device 1 according to the fourth modified example will be described with reference to the flowchart in FIG. 8.

In the flowchart shown in FIG. 8, steps S301 and S312 are the same as S101 and 5110 in the embodiment discussed above, then, steps S303, S304 and S313 are the same as S104, S105 and S111 in the embodiment discussed above, and hence their explanations are omitted. Note that if the environment in which to use the notebook PC 2 is the environment where the temperature of the battery 4 does not deviate from the specified temperature, S303 and S313 may also be omitted.

The power source control microcomputer 9, after confirming in S301 that the AC adaptor 5 is connected to the notebook PC 2, moves to net step (S302).

The power source control microcomputer 9 charges the battery 4 with the electricity up to the full-charge state in S302. After the battery 4 has reached to the full-charge state, the operation proceeds to next step (S303).

The power source control microcomputer 9, after confirming in S303 that the temperature of the battery 4 is equal to higher than the specified temperature, switches over the source of the power supply to the load 3 from the AC adaptor 5 to the battery 4 (S304). Then, after switching over the source of the power supply to the load 3 from the AC adaptor 5 to the battery 4, the signal about the output current of the battery 4 is acquired, and the integration of the output current is started (S305).

Figures 9, 10:
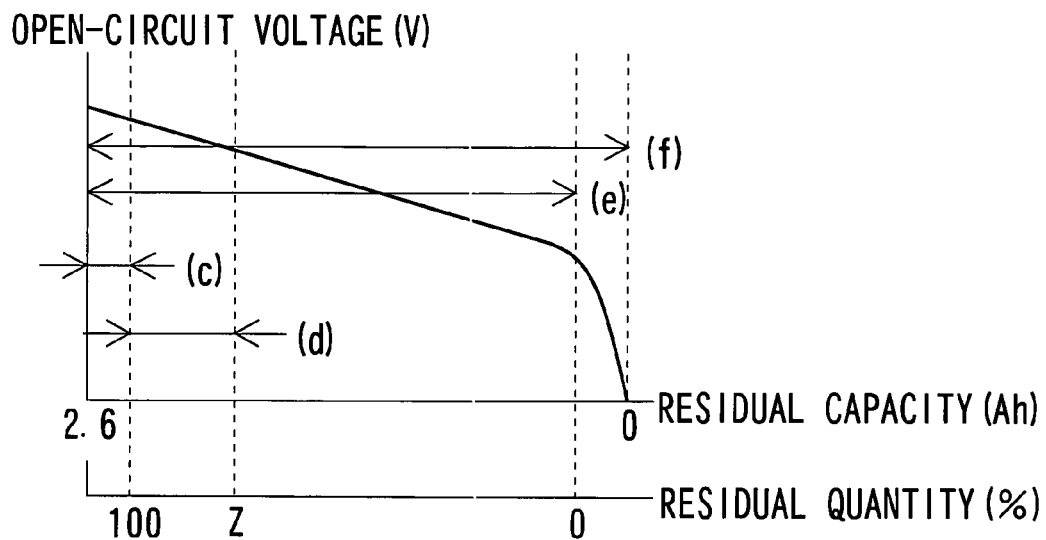
FIG. 9 is a graph showing a relationship between the residual quantity ratio, the residual capacity and the open-circuit voltage of the battery.
FIG. 10 is one example of an input screen that accepts a request from a user.

FIG. 9 is a graph showing a relationship between the residual quantity ratio (%), the residual capacity (Ah) and the open-circuit voltage (V) of the battery 4. An assumption is that the power source control microcomputer 9 starts integrating the output current of the battery 4 from the full-charge state (corresponding to, i.e., a residual capacity "2.6(Ah)" in FIG. 9) of the battery 4 in the graph in FIG. 9.

The power source control microcomputer 9, after the start of integrating the output current of the battery 4 in S305, continues to integrate the output current till the residual quantity ratio of the battery 4 reaches 100 (%) (S306). The power source control microcomputer 9, when coming to the state of the residual quantity ratio 100(%) of the battery 4, interrupts the integration of the output current, and stores the integrated value (indicated by (c) in FIG. 9) of the output current (which corresponds to a [second integrated current] according to the present invention) (S307). The power source control microcomputer 9 acquires the integrated value of the output current of the battery 4, and thereafter moves to step (S308).

The power source control microcomputer 9, after resuming the integration of the output current of the battery 4 in S308, continues to integrate the output current till the residual quantity ratio of the battery 4 reaches to the specified residual quantity ratio Z (%) (S309). The power source control microcomputer 9, when the battery 4 comes to a state of the specified residual quantity ratio Z (%) of the residual quantity that is less than the residual quantity ratio 100(%), stops integrating the output current, and stores the integrated value (indicated by (d) in FIG. 9) of the output current. The power source control microcomputer 9 acquires the integrated value (d) of the output current of the battery 4, and thereafter moves to step (S310).

The power source control microcomputer 9 calculates a full-charge capacity (indicated by (e) in FIG. 9) of the battery 4 from the acquired integrated value (c), integrated value (d) and residual quantity ratio Z (S310). The full-charge capacity of the battery 4 is calculated by the mathematical expression such as "Full-Charge Capacity (e)=(Integrated Value (c)+Integrated Value (d)×100+(100−Residual Quantity Ratio Z))". The power source control microcomputer 9 calculates the full-charge capacity (e) of the battery 4, and thereafter moves to step (S311).

The power source control microcomputer 9, in order to restrain the decrease in residual quantity of the battery 4, closes the switch 12 and switches over the source of the power supply to the load 3 from the battery 4 to the AC adaptor 5 (S311).

<Effect in Fourth Modified Example>

From the above, the battery control device 1 according to the fourth modified example is capable of increasing the accuracy by correcting the full-charge capacity of the battery 4.

Note that the correction of the full-charge capacity according to the fourth modified example may also be done in response to a request given from the user. FIG. 10 shows one example of an input screen for accepting the request from the user. One of checkboxes on the input screen is checked, and a setup button is pressed, thereby transmitting the user's request to the power source control microcomputer 9.

Further, if the user makes no request for correcting the full-charge capacity, the full-charge capacity may also be corrected after an elapse of a predetermined period since the full-charge capacity has been calculated. Herein, the "predetermined period" connotes the integrated period of usage time of the battery 4, e.g., the period of time enabling the variation quantity of the full-charge capacity to be ignored even when repeating the charging/discharging of the battery 4.

Fifth Modified Example

In the fourth modified example described above, the power source control microcomputer 9 corrects the full-charge capacity of the battery 4 by adding the capacity above the residual quantity ratio 100% of the battery 4. The present invention is not, however, limited to this correction mode. Namely, the full-charge capacity of the battery 4 may further be corrected by making the modification as follows.

In S310 in the fourth modified example described above, the calculated full-charge capacity (e) is further multiplied by a correcting coefficient $\alpha$. The correcting coefficient $\alpha$ is a value obtained by adding "1" to a ratio at which the integrated value of the current outputted during a transition of the battery 4 from a residual quantity ratio 0% state to an over-discharge state occupies the whole capacity, e.g., the correcting coefficient $\alpha$ is set such as the correcting coefficient $\alpha$=1.02.

From the above, the battery control device 1 according to the fifth modified example is capable of increasing the accuracy by correcting the full-charge capacity of the battery 4.

Note that the correction of the full-charge capacity according to the fifth modified example may be done, in the same way as in the fourth modified example, in response to the request given from the user, and may also be done at an interval of the predetermined period if none of the request is made by the user.

Sixth Modified Example

The battery control device 1 may make the modification to further store the calculated full-charge capacity in the memory 14 provided within the battery 4. This modification eliminates a necessity of measuring again the full-charge capacity each time the battery 4 is exchanged.

Seventh Modified Example

Figure 11:
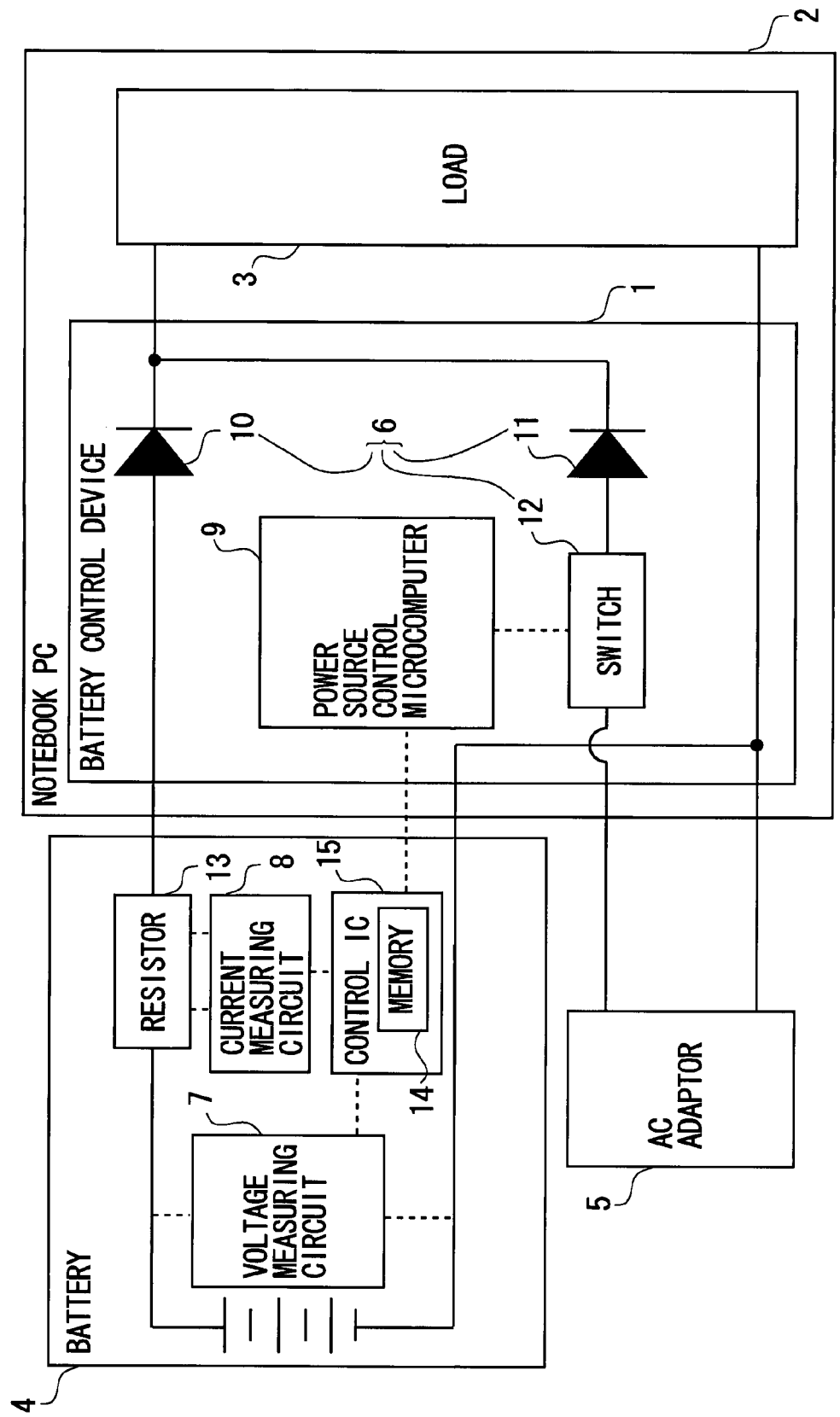
FIG. 11 is a diagram of a configuration of the notebook PC mounted with the battery control device.

The battery control device 1 internally has the voltage measuring circuit 7 and the current measuring circuit 8, however, the present invention is not limited to this configuration. FIG. 11 shows a diagram of a configuration of the notebook PC 2 mounted with the battery control device 1 according to the seventh modified example. As illustrated in FIG. 11, a control IC 15, the voltage measuring circuit 7 and the current measuring circuit 8 are disposed inwardly of the battery 4 (battery pack), wherein the voltage signal measured by the voltage measuring circuit 7 and the current signal measured by the current measuring circuit 8, may be transferred via the control IC 15 to the power source control microcomputer 9.

<Recording Medium Readable by Computer>

A program for making a computer, other machines, devices (which will hereinafter be referred to as the computer etc) actualize any one of the functions given above can be recorded on a recording medium readable by the computer etc. Then, the computer etc is made to read and execute the program on this recording medium, whereby the function can be provided.

Herein, the recording medium readable by the computer etc connotes a recording medium capable of storing information such as data and programs electrically, magnetically, optically, mechanically or by chemical action, which can be read from the computer etc. Among these recording mediums, for example, a flexible disk, a magneto-optic disk, a CD-ROM, a CD-R/W, a DVD, a DAT, an 8 mm tape, a memory card, etc are given as those demountable from the computer etc.

Further, a hard disk, a ROM (Read-Only Memory), etc are given as the recording mediums fixed within the computer etc.

<Others>

The disclosures of Japanese patent application No. JP2006-238679 filed on Sep. 4, 2006 including the specification, drawings and abstract are incorporated herein by reference.

What is claimed is:

1. A battery control device, comprising:
   an electric circuit control unit controlling a power supply to a load from a battery;
   a voltage measuring unit measuring a voltage of the battery;
   a current measuring unit measuring an electric current of the battery;
   a power source control unit outputting a control signal to the electric circuit control unit and receiving measurement signals from the voltage measuring unit and the current measuring unit; and
   a pre-generated map representing a relationship between the open-circuit voltage and a battery residual quantity ratio defined as a value showing a ratio at which a residual quantity of the battery occupies the whole capacity thereof,
   wherein the power source control unit calculates an internal impedance of the battery by measuring a first voltage defined as the voltage of the battery and a first current defined as the current of the battery in a state where the battery supplies electric power to the load, measuring a second voltage defined as the voltage of the battery in a state where the supply of the electric power to the load from the battery is cut off and dividing a value obtained in a way that subtracts the first voltage from the second voltage by the first current,
   calculates an open-circuit voltage of the battery by measuring a third voltage defined as the voltage of the battery and a second current defined as the electric current of the battery in the state where the battery supplies the electric power to the load and adding the third voltage to a value obtained in a way that multiplies the internal impedance by the second current,
   acquires the battery residual quantity ratio of the battery by collating the open-circuit voltage with the pre-generated map,
   measures a first battery residual quantity ratio defined as a value showing a ratio at which the residual quantity of the battery occupies the whole capacity thereof by calculating the open-circuit voltage in a first battery state as a battery state before the residual quantity decreases and collating the open-circuit voltage with the map,
   measures a second battery residual quantity ratio defined as a value showing a ratio at which the residual quantity of the battery occupies the whole capacity thereof by calculating the open-circuit voltage of the battery in a second battery state that is a battery state after the residual quantity has decreased and collating the open-circuit voltage with the map,
   measures a first integrated current defined as an integrated value of the electric current outputted during a transition of the battery from the first battery state to the second battery state, and
   calculates the full-charge capacity of the battery in a way that divides the first integrated current by a value obtained by subtracting the second battery residual quantity ratio from the first battery residual quantity ratio.

2. A battery control device according to claim 1,
   wherein the power source control unit further measures a second integrated current defined as an integrated value of the electric current outputted during a transition of the residual quantity of the battery from a full-charge state to a 100% state, and
   further corrects the full-charge capacity of the battery by adding the second integrated current to the full-charge capacity.

3. A battery control device according to claim 1, wherein the power source control unit further corrects the full-charge capacity by multiplying the full-charge capacity by a value obtained by adding "1" to a ratio at which the capacity till the residual quantity of the battery reaches an over-discharge state from a 0% state, occupies the whole capacity.

4. A battery control device according to claim 1,
   further comprising a temperature detecting unit measuring a temperature of the battery,
   wherein the power source control unit further calculates the full-charge capacity when the temperature of the battery is equal to or higher than a predetermined temperature.

5. A battery control device according to claim 1,
   wherein the first battery state is a state before the battery starts supplying the electric power to the load, and
   the second battery state is a state after the battery has stopped supplying the electric power to the load.

6. A battery control device according to claim 1, wherein a relationship between the battery residual quantity ratio and the open-circuit voltage, which are specified in the map, is a relationship specified by data previously measured by a measuring device when manufacturing the battery.

7. A battery control device according to claim 1,
   wherein the electric circuit control unit includes:
   a first diode disposed on a power supply circuit that connects the battery to the load without a switch along a path of the power supply circuit; and
   a switch disposed on a power supply circuit to the load from a power source device of which a voltage is higher than the voltage of the battery, and
   wherein when opening the switch, the electric power is supplied to the load from the battery while cutting off the power supply to the load from the power source device, and, when closing the switch, the power supply to the load from the battery is cut off while supplying the electric power to the load from the power source device.

8. A battery control method of a battery control device comprising:
   controlling, with an electric circuit control unit, a power supply to a load from a battery;
   measuring a voltage of the battery;
   measuring an electric current of the battery; and
   outputting, with a power source control unit, a control signal to the electric circuit control unit and receiving measurement signals from the voltage measuring unit and the current measuring unit,
   wherein the power source control unit calculates an internal impedance of the battery by measuring a first voltage defined as the voltage of the battery and a first current defined as the current of the battery in a state where the battery supplies electric power to the load, measuring a second voltage defined as the voltage of the battery in a state where the supply of the electric power to the load from the battery is cut off and dividing a value obtained in a way that subtracts the first voltage from the second voltage by the first current,
   calculates an open-circuit voltage of the battery by measuring a third voltage defined as the voltage of the battery and a second current defined as the electric current of the battery in the state where the battery supplies the electric power to the load and adding the third voltage to a value obtained in a way that multiplies the internal impedance by the second current, acquires the battery residual quantity ratio of the battery by collating the open-circuit voltage with a pre-generated map representing a relationship between the open-circuit voltage and a battery residual quantity ratio defined as a value showing a ratio at which a residual quantity of the battery occupies the whole capacity thereof, measures a first battery residual quantity ratio defined as a value showing a ratio at which the residual quantity of the battery occupies the whole capacity thereof by calculating the open-circuit voltage in a first battery state as a battery state before the residual quantity decreases and collating the open-circuit voltage with the map, measures a second battery residual quantity ratio defined as a value showing a ratio at which the residual quantity of the battery occupies the whole capacity thereof by calculating the open-circuit voltage of the battery in a second battery state that is a battery state after the residual quantity has decreased and collating the open-circuit voltage with the map, measures a first integrated current defined as an integrated value of the electric current outputted during a transition of the battery from the first battery state to the second battery state, and calculates the full-charge capacity of the battery in a way that divides the first integrated current by a value obtained by subtracting the second battery residual quantity ratio from the first battery residual quantity ratio.

9. A battery control method according to claim 8, wherein the power source control unit further measures a second integrated current defined as an integrated value of the electric current outputted during a transition of the residual quantity of the battery from a full-charge state to a 100% state, and further corrects the full-charge capacity of the battery by adding the second integrated current to the full-charge capacity.

10. A battery control method according to claim 8, wherein the power source control unit further corrects the full-charge capacity by multiplying the full-charge capacity by a value obtained by adding "1" to a ratio at which the capacity till the residual quantity of the battery reaches an over-discharge state from a 0% state, occupies the whole capacity.

11. A battery control method according to claim 8, wherein the battery control device further includes temperature detecting unit measuring a temperature of the battery, wherein the power source control unit further calculates the full-charge capacity when the temperature of the battery is equal to or higher than a predetermined temperature.

12. A battery control method according to claim 8, wherein the first battery state is a state before the battery starts supplying the electric power to the load, and the second battery state is a state after the battery has stopped supplying the electric power to the load.

13. A battery control method according to claim 8, wherein a relationship between the battery residual quantity ratio and the open-circuit voltage, which are specified in the map, is a relationship specified by data previously measured by a measuring device when manufacturing the battery.

14. A battery control method according to claim 8, wherein the electric circuit control unit includes:

a first diode disposed on a power supply circuit that connects the battery to the load without a switch along a path of the power supply circuit; and a switch disposed on a power supply circuit to the load from a power source device of which a voltage is higher than the voltage of the battery, and wherein when opening the switch, the electric power is supplied to the load from the battery while cutting off the power supply to the load from the power source device, and, when closing the switch, the power supply to the load from the battery is cut off while supplying the electric power to the load from the power source device.

15. A power source control device used for an electronic apparatus comprising:

an electric circuit control unit controlling a power supply to a load from a battery;

a voltage measuring unit measuring a voltage of the battery;

a current measuring unit measuring an electric current of the battery; and a pre-generated map representing a relationship between the open-circuit voltage and a battery residual quantity ratio defined as a value showing a ratio at which a residual quantity of the battery occupies the whole capacity thereof, wherein the power source control unit calculates an internal impedance of the battery by measuring a first voltage defined as the voltage of the battery and a first current defined as the current of the battery in a state where the battery supplies electric power to the load, measuring a second voltage defined as the voltage of the battery in a state where the supply of the electric power to the load from the battery is cut off and dividing a value obtained in a way that subtracts the first voltage from the second voltage by the first current, calculates an open-circuit voltage of the battery by measuring a third voltage defined as the voltage of the battery and a second current defined as the electric current of the battery in the state where the battery supplies the electric power to the load and adding the third voltage to a value obtained in a way that multiplies the internal impedance by the second current, acquires the battery residual quantity ratio of the battery by collating the open-circuit voltage with the pre-generated map, measures a first battery residual quantity ratio defined as a value showing a ratio at which the residual quantity of the battery occupies the whole capacity thereof by calculating the open-circuit voltage in a first battery state as a battery state before the residual quantity decreases and collating the open-circuit voltage with the map, measures a second battery residual quantity ratio defined as a value showing a ratio at which the residual quantity of the battery occupies the whole capacity thereof by calculating the open-circuit voltage of the battery in a second battery state that is a battery state after the residual quantity has decreased and collating the open-circuit voltage with the map, measures a first integrated current defined as an integrated value of the electric current outputted during a transition of the battery from the first battery state to the second battery state, and calculates the full-charge capacity of the battery in a way that divides the first integrated current by a value obtained by subtracting the second battery residual quantity ratio from the first battery residual quantity ratio.

16. A power source control device according to claim 15, wherein the electric circuit control unit includes:
a first diode disposed on a power supply circuit that connects the battery to the load without a switch along a path of the power supply circuit; and
a switch disposed on a power supply circuit to the load from a power source device of which a voltage is higher than the voltage of the battery, and
wherein when opening the switch, the electric power is supplied to the load from the battery while cutting off the power supply to the load from the power source device, and, when closing the switch, the power supply to the load from the battery is cut off while supplying the electric power to the load from the power source device.

17. An electronic apparatus including a battery and driven by electric power, comprising:
an electric circuit control unit controlling a power supply to a load within the electronic apparatus from a battery;
a voltage measuring unit measuring a voltage of the battery;
a current measuring unit measuring an electric current of the battery;
a power source control unit outputting a control signal to the electric circuit control unit, and receiving measurement signals from the voltage measuring unit and the current measuring unit; and
a pre-generated map representing a relationship between the open-circuit voltage and a battery residual quantity ratio defined as a value showing a ratio at which a residual quantity of the battery occupies the whole capacity thereof,
wherein the power source control unit calculates an internal impedance of the battery by measuring a first voltage defined as the voltage of the battery and a first current defined as the current of the battery in a state where the battery supplies electric power to the load, measuring a second voltage defined as the voltage of the battery in a state where the supply of the electric power to the load from the battery is cut off and dividing a value obtained in a way that subtracts the first voltage from the second voltage by the first current,
calculates an open-circuit voltage of the battery by measuring a third voltage defined as the voltage of the battery and a second current defined as the electric current of the battery in the state where the battery supplies the electric power to the load and adding the third voltage to a value obtained in a way that multiplies the internal impedance by the second current,
acquires the battery residual quantity ratio of the battery by collating the open-circuit voltage with the pre-generated map,
measures a first battery residual quantity ratio defined as a value showing a ratio at which the residual quantity of the battery occupies the whole capacity thereof by calculating the open-circuit voltage in a first battery state as a battery state before the residual quantity decreases and collating the open-circuit voltage with the map,
measures a second battery residual quantity ratio defined as a value showing a ratio at which the residual quantity of the battery occupies the whole capacity thereof by calculating the open-circuit voltage of the battery in a second battery state that is a battery state after the residual quantity has decreased and collating the open-circuit voltage with the map,
measures a first integrated current defined as an integrated value of the electric current outputted during a transition of the battery from the first battery state to the second battery state, and
calculates the full-charge capacity of the battery in a way that divides the first integrated current by a value obtained by subtracting the second battery residual quantity ratio from the first battery residual quantity ratio.

18. An electronic apparatus according to claim 17, wherein the electric circuit control unit includes:
a first diode disposed on a power supply circuit that connects the battery to the load without a switch along a path of the power supply circuit; and
a switch disposed on a power supply circuit to the load from a power source device of which a voltage is higher than the voltage of the battery, and
wherein when opening the switch, the electric power is supplied to the load from the battery while cutting off the power supply to the load from the power source device, and, when closing the switch, the power supply to the load from the battery is cut off while supplying the electric power to the load from the power source device.

19. A recording medium recorded with a battery control program for a battery control device comprising:
an electric circuit control unit controlling a power supply to a load from a battery;
a voltage measuring unit measuring a voltage of the battery;
a current measuring unit measuring an electric current of the battery;
a power source control unit outputting a control signal to the electric circuit control unit, and receiving measurement signals from the voltage measuring unit and the current measuring unit; and
a pre-generated map representing a relationship between the open-circuit voltage and a battery residual quantity ratio defined as a value showing a ratio at which a residual quantity of the battery occupies the whole capacity thereof,
the program making the battery control device execute:
calculating an internal impedance of the battery by measuring a first voltage defined as the voltage of the battery and a first current defined as the current of the battery in a state where the battery supplies electric power to the load, measuring a second voltage defined as the voltage of the battery in a state where the supply of the electric power to the load from the battery is cut off and dividing a value obtained in a way that subtracts the first voltage from the second voltage by the first current,
calculating an open-circuit voltage of the battery by measuring a third voltage defined as the voltage of the battery and a second current defined as the electric current of the battery in the state where the battery supplies the electric power to the load and adding the third voltage to a value obtained in a way that multiplies the internal impedance by the second current,
acquiring the battery residual quantity ratio of the battery by collating the open-circuit voltage with the pre-generated map,
measuring a first battery residual quantity ratio defined as a value showing a ratio at which the residual quantity of the battery occupies the whole capacity thereof by calculating the open-circuit voltage in a first battery state as a battery state before the residual quantity decreases and collating the open-circuit voltage with the map, measuring a second battery residual quantity ratio defined as a value showing a ratio at which the residual quantity of the battery occupies the whole capacity thereof by calculating the open-circuit voltage of the battery in a second battery state that is a battery state after the residual quantity has decreased and collating the open-circuit voltage with the map, measuring a first integrated current defined as an integrated value of the electric current outputted during a transition of the battery from the first battery state to the second battery state, and calculating the full-charge capacity of the battery in a way that divides the first integrated current by a value obtained by subtracting the second battery residual quantity ratio from the first battery residual quantity ratio.

20. A recording medium according to claim 19, wherein the electric circuit control unit includes:

a first diode disposed on a power supply circuit that connects the battery to the load without a switch along a path of the power supply circuit; and a switch disposed on a power supply circuit to the load from a power source device of which a voltage is higher than the voltage of the battery, and wherein when opening the switch, the electric power is supplied to the load from the battery while cutting off the power supply to the load from the power source device, and, when closing the switch, the power supply to the load from the battery is cut off while supplying the electric power to the load from the power source device.

* * * * *